(12) United States Patent
Tsao et al.

(10) Patent No.: US 7,800,109 B2
(45) Date of Patent: Sep. 21, 2010

(54) THIN FILM TRANSISTOR WITH ELECTRODES RESISTANT TO OXIDATION AND EROSION

(75) Inventors: Wen-Kuang Tsao, Taoyuan County (TW); Hung-I Hsu, Miaoli County (TW); Hsiang-Hsien Chung, Taoyuan County (TW); Min-Huang Chen, Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 466 days.

(21) Appl. No.: 10/907,956

(22) Filed: Apr. 22, 2005

(65) Prior Publication Data

US 2006/0237724 A1    Oct. 26, 2006

(51) Int. Cl.
*H01L 29/76* (2006.01)

(52) U.S. Cl. .................................... 257/66; 257/347
(58) Field of Classification Search .................. 257/66, 257/67, 347
See application file for complete search history.

(56) References Cited

U.S. PATENT DOCUMENTS 5,468,697 A * 11/1995 Yamaguchi et al. ......... 501/95.3
6,624,864 B1 * 9/2003 Kubo et al. .................. 349/139

* cited by examiner

*Primary Examiner*—Ori Nadav
(74) *Attorney, Agent, or Firm*—Jianq Chyun IP Office

(57) ABSTRACT

A thin film transistor including a gate, a gate insulating layer, a semiconductor layer, a source electrode and a drain electrode is provided. The gate is disposed over a substrate, wherein the gate comprises at least one layer of aluminum-yttrium alloy nitride. The gate insulating layer is formed over the substrate to cover the gate. The semiconductor layer is disposed over the gate insulating layer above the gate. The source electrode and the drain electrode are disposed over the semiconductor layer.

7 Claims, 2 Drawing Sheets

THIN FILM TRANSISTOR WITH ELECTRODES RESISTANT TO OXIDATION AND EROSION

BACKGROUND OF THE INVENTION

1. Field of the Invention

The present invention generally relates to a semiconductor device and a method of forming the same. More particularly, the present invention relates to a thin film transistor and a method of forming the same.

2. Description of Related Art

A thin film transistor (TFT) typically includes a gate, a gate insulating layer, a channel layer, a source electrode and a drain electrode, and is usually used as a switching device in displays such as liquid crystal displays (LCD). Usually, the TFT is formed by sequentially forming a gate, a gate insulating layer, an α-Si channel layer, a source electrode and a drain electrode on a substrate. The gate is constituted of a single metal layer of aluminum (Al), chromium (Cr), tungsten (W), tantalum (Ta) or titanium (Ti), or constituted of multiple metal layers.

However, when a single-layered of the above-mentioned metal is used to form the gate, the surface of the layer is easily eroded and easily reacts with oxygen in the atmosphere to form a metal oxide that cannot be effectively etched in the subsequent etching process. On the other hand, when the gate is constituted of multiple metal layers, such as molybdenum (Mo)/Al/Mo, to prevent oxidation and erosion, the process for forming multiple metal layers is surely more complex because more than one sputtering targets and deposition chambers are required. Moreover, the above problems also occur in the process for forming the source electrode and the drain electrode.

SUMMARY OF THE INVENTION

Accordingly, the present invention is directed to a thin film transistor having a gate, a source electrode and a drain electrode having a lower contact resistance or wire resistance.

The present invention is directed to a method of forming a thin film transistor that uses a material resistant to oxidation and erosion to form a gate and/or a source electrode and a drain electrode.

According to an embodiment of the present invention, a thin film transistor is provided. The thin film transistor includes a gate, a gate insulating layer, a semiconductor layer, a source electrode and a drain electrode. The gate is disposed over a substrate, wherein the gate comprises at least one layer of aluminum-yttrium alloy nitride. The gate insulating layer is formed over the substrate to cover the gate. The semiconductor layer is disposed over the gate insulating layer above the gate. The source electrode and the drain electrode are disposed over the semiconductor layer.

According to an embodiment of the present invention, a thin film transistor is provided. The thin film transistor includes a gate, a gate insulating layer, a semiconductor layer, a source electrode and a drain electrode. The gate is disposed over a substrate. The gate insulating layer is formed over the substrate to cover the gate. The semiconductor layer is disposed over the gate insulating layer above the gate. The source electrode and the drain electrode are disposed over the semiconductor layer, wherein the source electrode and the drain electrode comprise at least one layer of aluminum-yttrium alloy nitride.

According to an embodiment of the present invention, the gate is constituted of an aluminum-yttrium alloy layer and an aluminum-yttrium alloy nitride layer.

According to an embodiment of the present invention, the gate is constituted of a first aluminum-yttrium alloy nitride layer, an aluminum-yttrium alloy layer and a second aluminum-yttrium alloy nitride layer.

According to an embodiment of the present invention, the source electrode and the drain electrode are constituted of an aluminum-yttrium alloy layer and an aluminum-yttrium alloy nitride layer.

According to an embodiment of the present invention, the source electrode and the drain electrode are constituted of a first aluminum-yttrium alloy nitride layer, an aluminum-yttrium alloy layer and a second aluminum-yttrium alloy nitride layer.

A method of forming a thin film transistor is provided according to an embodiment of the present invention. A gate is formed over a substrate, wherein the gate comprises at least one layer of aluminum-yttrium alloy nitride. A gate insulating layer is formed over the substrate to cover the gate. A semiconductor layer is formed over the gate insulating layer above the gate. A source electrode and a drain electrode are formed over the semiconductor layer.

A method of forming a thin film transistor is provided according to another embodiment of the present invention. A gate is formed over a substrate. A gate insulating layer is formed over the substrate to cover the gate. A semiconductor layer is formed over the gate insulating layer above the gate. A source electrode and a drain electrode are formed over the semiconductor layer, wherein the source electrode and the drain electrode comprise at least one layer of aluminum-yttrium alloy nitride.

According to an embodiment of the present invention, the gate and/or the source electrode and the drain electrode can be formed by the steps of forming an aluminum-yttrium alloy layer over the substrate; performing a nitridation step for the aluminum-yttrium alloy layer to form an aluminum-yttrium alloy nitride layer; and patterning the aluminum-yttrium alloy nitride layer to form the gate and/or the source electrode and the drain electrode.

According to an embodiment of the present invention, the gate and/or the source electrode and the drain electrode can be formed by the steps of forming a first aluminum-yttrium alloy layer over the substrate; forming a second aluminum-yttrium alloy layer over the first aluminum-yttrium alloy layer; performing a nitridation step for the second aluminum-yttrium alloy layer to form an aluminum-yttrium alloy nitride layer on the first aluminum-yttrium alloy layer; and patterning the aluminum-yttrium alloy nitride layer and the first aluminum-yttrium alloy layer to form the gate and/or the source electrode and the drain electrode.

According to an embodiment of the present invention, the gate and/or the source electrode and the drain electrode can be formed by the steps of forming a first aluminum-yttrium alloy layer over the substrate; performing a first nitridation step for the first aluminum-yttrium alloy layer to form a first aluminum-yttrium alloy nitride layer; forming a second aluminum-yttrium alloy layer over the first aluminum-yttrium alloy nitride layer; forming a third aluminum-yttrium alloy layer over the second aluminum-yttrium alloy layer; and performing a second nitridation step for the third aluminum-yttrium alloy layer to form a second aluminum-yttrium alloy nitride layer on the second aluminum-yttrium alloy layer; and patterning the second aluminum-yttrium alloy nitride layer, the second aluminum-yttrium alloy layer and the first aluminum-yttrium alloy nitride layer to form the gate and/or the source electrode and the drain electrode.

The electrodes (gate and/or source electrode and drain electrode) of the thin film transistor comprise at least one layer of aluminum-yttrium alloy nitride layer which is more stable than metal alloy used in the prior art because a nitride protective thin film is formed on the surface of the aluminum-yttrium alloy so that the electrodes are more resistant to oxidation and erosion.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
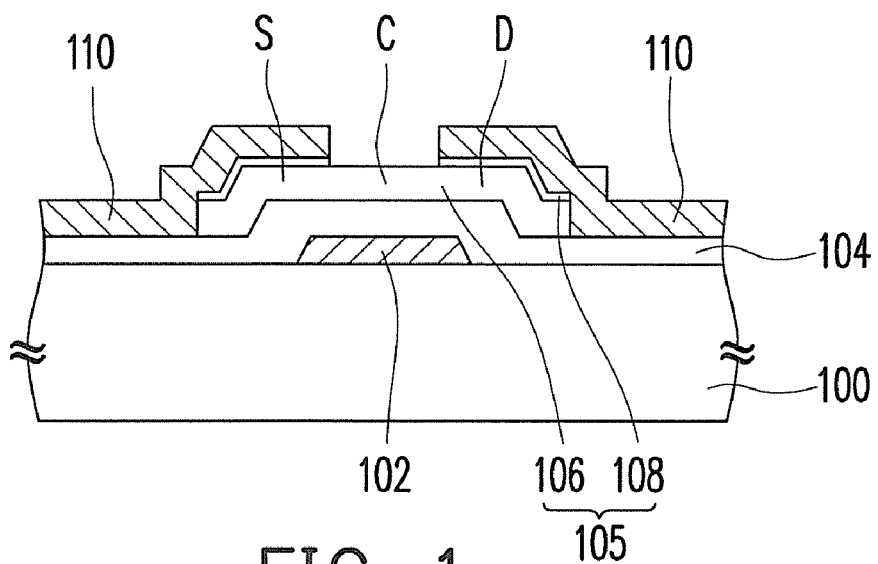
FIG. 1 is a cross-sectional view of a thin film transistor according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional view of a thin film transistor according to an embodiment of this invention. As shown in FIG. 1, the thin film transistor includes a gate 102, a gate insulating layer 104, a semiconductor layer 105 and a source/drain 110. The gate 102 is disposed over a substrate 100. The gate insulating layer 104 is disposed over the substrate 110 to cover the gate 102. The gate insulating layer 104 is constituted of a silicon oxide layer, a silicon nitride layer or a combination thereof, for example. The semiconductor layer 105 is disposed over the gate insulating layer 104 above the gate 102. The semiconductor layer 105 comprises a source region S, a drain region D and a channel region C between the source region S and the drain region D. The source/drain 110 is disposed over the semiconductor layer 105. In an embodiment, the semiconductor layer 105 comprises a channel layer 106 formed on the gate insulating layer 104 and an ohmic contact layer 108 formed between the channel layer 106 and the source/drain 110.

In particular, the gate 102 comprises at least one layer of aluminum-yttrium (Al—Y) alloy nitride according to an embodiment of the present invention. In other words, the gate 102 may be a single-layer of aluminum-yttrium alloy nitride or a multiple layer comprising at least one aluminum-yttrium alloy nitride layer. If the gate 102 is a single layer, the gate 102 is composed of an aluminum-yttrium alloy nitride layer. In the case, the method of forming the single-layered gate 102 is as following steps. First, an aluminum-yttrium alloy layer is formed over the substrate 100 in a sputtering process chamber, an evaporation process chamber or other known deposition chamber. A nitridation step is performed for the aluminum-yttrium alloy layer so as to form an aluminum-yttrium alloy nitride layer. The nitridation step can be carried out with flowing nitrogen gas into the above deposition chamber after forming the aluminum-yttrium alloy layer, for example, or flowing nitrogen gas into the above deposition chamber when depositing the aluminum-yttrium alloy layer, for example. Thereafter, the aluminum-yttrium alloy nitride layer is patterned by photolithography process and etching process to form the gate 102.

Figure 2A:
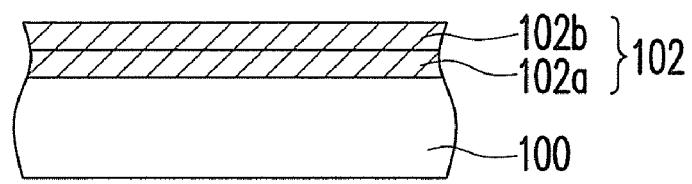
FIG. 2A is a cross-sectional view showing a two-layered gate of a thin film transistor according to an embodiment of this invention.

If the gate 102 is a two-layered structure, the gate 102 is constituted of an aluminum-yttrium alloy layer 102a and an aluminum-yttrium alloy nitride layer 102b (as shown in FIG. 2A). In the case, the method of forming the two-layered gate 102 is as following steps. First, a first aluminum-yttrium alloy layer 102a is formed over the substrate 100. A second aluminum-yttrium alloy layer (not shown) is formed over the first aluminum-yttrium alloy layer 102a. A nitridation step is performed for the second aluminum-yttrium alloy layer so as to form an aluminum-yttrium alloy nitride layer 102b. Thereafter, the aluminum-yttrium alloy nitride layer 102b and the first aluminum-yttrium alloy layer 102a are patterned to form the gate 102. The first aluminum-yttrium alloy layer 102a and the second aluminum-yttrium alloy layer are formed by the method as above mentioned, and the nitridation step is also performed with the similar method as above mentioned.

Figure 3A:
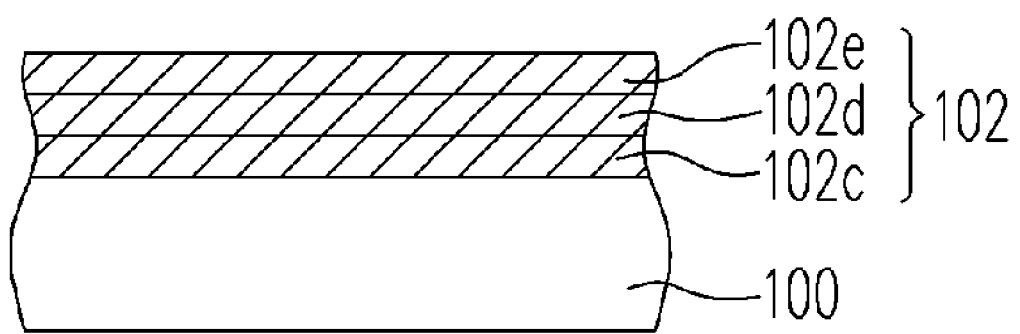
FIG. 3A is a cross-sectional view showing a three-layered gate of a thin film transistor according to an embodiment of this invention.

When the gate 102 is a three-layered structure, the gate 102 is constituted of a first aluminum-yttrium alloy nitride layer 102c, an aluminum-yttrium alloy layer 102d and a second aluminum-yttrium alloy nitride layer 102e (as shown in FIG. 3A). In the case, the method of forming the three-layered gate 102 is as following steps. First, a first aluminum-yttrium alloy layer (not shown) is formed over the substrate 100. A nitridation step as above mentioned is performed for the first aluminum-yttrium alloy layer so as to form a first aluminum-yttrium alloy nitride layer 102c. Then, a second aluminum-yttrium alloy layer 102d is formed over the first aluminum-yttrium alloy nitride layer 102c, and a third aluminum-yttrium alloy layer (not shown) is formed over the second aluminum-yttrium alloy layer 102d. A nitridation step as above mentioned is performed for the third aluminum-yttrium alloy layer so as to form a second aluminum-yttrium alloy nitride layer 102e. Thereafter, the second aluminum-yttrium alloy nitride layer 102e, the second aluminum-yttrium alloy layer 102d and the first aluminum-yttrium alloy nitride layer 102c are patterned to form the gate 102.

In another embodiment, the source electrode and the drain electrode 110 comprise at least one layer of aluminum-yttrium (Al—Y) alloy nitride, as shown in FIG. 1. In other words, the source electrode and the drain electrode 110 may be a single-layer of aluminum-yttrium alloy nitride or a multiple layer comprising at least one aluminum-yttrium alloy nitride layer. If the source electrode and the drain electrode 110 are a single-layer, the source electrode and the drain electrode 110 are composed of an aluminum-yttrium alloy nitride layer. Similarly, the method of forming the single-layered source electrode and the drain electrode 110 is as following steps. First, an aluminum-yttrium alloy layer is formed over the gate insulating layer 104 to cover the semiconductor layer 105 in a sputtering process chamber, an evaporation process chamber or other known deposition chamber. A nitridation step is performed for the aluminum-yttrium alloy layer so as to form an aluminum-yttrium alloy nitride layer. The nitridation step can be carried out with flowing nitrogen gas into the above deposition chamber after forming the aluminum-yttrium alloy layer, for example, or flowing nitrogen gas into the above deposition chamber when depositing the aluminum-yttrium alloy layer, for example. Thereafter, the aluminum-yttrium alloy nitride layer is patterned to form the source electrode and the drain electrode 110.

Figure 2B:
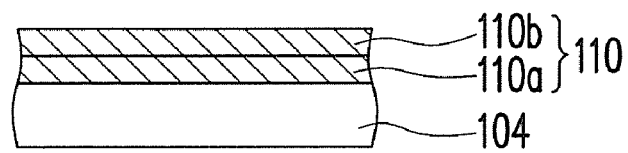
FIG. 2B is a cross-sectional view showing a two-layered source electrode and drain electrode of a thin film transistor according to another embodiment of this invention.

If the source electrode and the drain electrode 110 are a two-layered structure, the source electrode and the drain electrode 110 are constituted of an aluminum-yttrium alloy layer 110*a* and an aluminum-yttrium alloy nitride layer 110*b* (as shown in FIG. 2B). Similarly, the method of forming the two-layered source electrode and the drain electrode 110 is as following steps. First, a first aluminum-yttrium alloy layer 110*a* is formed over the gate insulating layer 104 to cover the semiconductor layer 105. A second aluminum-yttrium alloy layer (not shown) is formed over the first aluminum-yttrium alloy layer 110*a*. A nitridation step is performed for the second aluminum-yttrium alloy layer so as to form an aluminum-yttrium alloy nitride layer 110*b*. Thereafter, the aluminum-yttrium alloy nitride layer 110*b* and the first aluminum-yttrium alloy layer 110*a* are patterned to form the source electrode and the drain electrode 110. The first aluminum-yttrium alloy layer 110*a* and the second aluminum-yttrium alloy layer are formed by the method as above mentioned, and the nitridation step is also performed with the similar method as above mentioned.

Figure 3B:
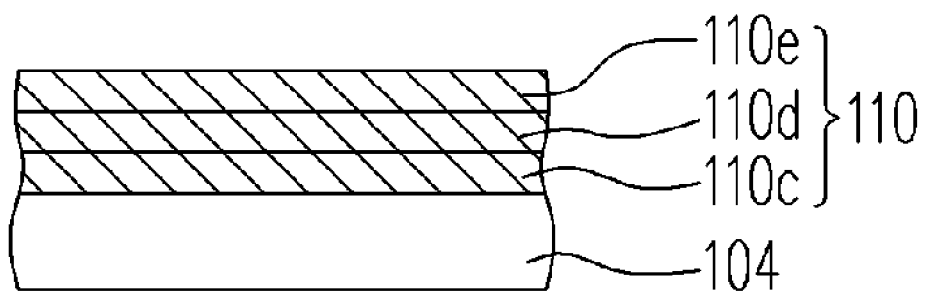
FIG. 3B is a cross-sectional view showing a three-layered source electrode and drain electrode of a thin film transistor according to another embodiment of this invention.

When the source electrode and the drain electrode 110 are a three-layered structure, the source electrode and the drain electrode 110 are constituted of a first aluminum-yttrium alloy nitride layer 110*c*, an aluminum-yttrium alloy layer 110*d* and a second aluminum-yttrium alloy nitride layer 110*e* (as shown in FIG. 3B). Similarly, the method of forming the three-layered source electrode and drain electrode 110 is as following steps. First, a first aluminum-yttrium alloy layer (not shown) is formed over the gate insulating layer 104 to cover the semiconductor layer 105. A nitridation step as above mentioned is performed for the first aluminum-yttrium alloy layer so as to form a first aluminum-yttrium alloy nitride layer 110*c*. Then, a second aluminum-yttrium alloy layer 110*d* is formed over the first aluminum-yttrium alloy nitride layer 110*c*, and a third aluminum-yttrium alloy layer (not shown) is formed over the second aluminum-yttrium alloy layer 110*d*. A nitridation step as above mentioned is performed for the third aluminum-yttrium alloy layer so as to form a second aluminum-yttrium alloy nitride layer 110*e*. Thereafter, the second aluminum-yttrium alloy nitride layer 110*e*, the second aluminum-yttrium alloy layer 110*d* and the first aluminum-yttrium alloy nitride layer 110*c* are patterned to form the source electrode and the drain electrode 110.

In another embodiment, the gate 102, the source electrode and the drain electrode 110 comprise at least one layer of aluminum-yttrium (Al—Y) alloy nitride, respectively. In other words, the gate 102, the source electrode and the drain electrode 110 can be a single-layer of aluminum-yttrium (Al—Y) alloy nitride or a multiple layer comprising at least one aluminum-yttrium alloy nitride layer, respectively. The multiple layer comprises at least one aluminum-yttrium alloy nitride layer can be a two-layered structure or a three-layered structure, as shown in FIGS. 2A, 2B, 3A and 3B.

It is noted that the aluminum-yttrium alloy nitride layer is more stable than metal alloy used in the prior art because a nitride protective thin film is formed on the surface of the aluminum-yttrium alloy so that the aluminum-yttrium alloy nitride layer is more resistant to oxidation and erosion. In other words, the electrodes of the thin film transistor comprising at least one layer of aluminum-yttrium alloy nitride layer are more resistant to oxidation and erosion. In particular, if a two-layered gate, source electrode or drain electrode is formed, the aluminum-yttrium alloy nitride layer overlies the aluminum-yttrium alloy layer to act as a protective layer. If a three-layered gate, source electrode or drain electrode is formed, the aluminum-yttrium alloy layer is sandwiched between the two aluminum-yttrium alloy nitride layers so as to protect the aluminum-yttrium alloy layer from oxidizing and eroding.

In addition, the deposition process of the aluminum-yttrium alloy layer and the nitridation step can be performed in the same chamber (in-situ). If the two-layered or three-layered structure is formed, these layers can also be formed in the same chamber (in-situ). Therefore, the gate and/or source electrode and drain electrode process of the present invention is not complex and the process throughput can be improved.

It should be noted that if the thin film transistor of the present invention is applied to a switching device of a LCD and if a two-layered or three-layered source electrode and drain electrode is used, the nitride thin film on the surface of the upper aluminum-yttrium alloy nitride layer can also act as an etching stop layer when a contact hole etching process for each pixel structure is performed subsequently.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor, comprising:
   a gate over a substrate, wherein the gate comprises a stacked structure having an aluminum-yttrium alloy layer without containing nitrogen and an aluminum-yttrium alloy nitride layer disposed over the aluminum-yttrium alloy layer;
   a gate insulating layer formed over the substrate to cover the gate;
   a semiconductor layer comprising a source region, a drain region and a channel region between the source region and the drain region, and the semiconductor layer is disposed over the gate insulating layer above the gate; and
   a source electrode and a drain electrode disposed over the semiconductor layer.

2. The thin film transistor according to claim 1, wherein the source electrode and the drain electrode comprise at least one layer of aluminum-yttrium alloy nitride.

3. The thin film transistor according to claim 2, wherein the source electrode and the drain electrode comprise:
   an aluminum-yttrium alloy layer; and
   an aluminum-yttrium alloy nitride layer disposed over the aluminum-yttrium alloy layer.

4. The thin film transistor according to claim 2, wherein the source electrode and the drain electrode comprise:
   a first aluminum-yttrium alloy nitride layer;
   an aluminum-yttrium alloy layer over the first aluminum-yttrium alloy nitride layer; and
   a second aluminum-yttrium alloy nitride layer disposed over the aluminum-yttrium alloy layer.

5. A thin film transistor, comprising:
   a gate over a substrate;
   a gate insulating layer over the substrate covering the gate;
   a semiconductor layer comprising a source region, a drain region and a channel region between the source region and the drain region, and the semiconductor layer is disposed over the gate insulating layer above the gate; and a source electrode and a drain electrode over the semiconductor layer, wherein the source electrode and the drain electrode respectively comprise a stacked structure having an aluminum-yttrium alloy layer without containing nitrogen and an aluminum-yttrium alloy nitride layer disposed over the aluminum-yttrium alloy layer.

6. A thin film transistor, comprising:
a gate over a substrate, wherein the gate comprises a stacked structure having:
   a first aluminum-yttrium alloy nitride layer;
   an aluminum-yttrium alloy layer without containing nitrogen over the first aluminum-yttrium alloy nitride layer; and
   a second aluminum-yttrium alloy nitride layer disposed over the aluminum-yttrium alloy layer;
a gate insulating layer formed over the substrate to cover the gate;
a semiconductor layer comprising a source region, a drain region and a channel region between the source region and the drain region, and the semiconductor layer is disposed over the gate insulating layer above the gate; and
a source electrode and a drain electrode disposed over the semiconductor layer.

7. A thin film transistor, comprising:
a gate over a substrate;
a gate insulating layer over the substrate covering the gate;
a semiconductor layer comprising a source region, a drain region and a channel region between the source region and the drain region, and the semiconductor layer is disposed over the gate insulating layer above the gate; and
a source electrode and a drain electrode over the semiconductor layer, wherein the source electrode and the drain electrode respectively comprise a stacked structure having:
   a first aluminum-yttrium alloy nitride layer;
   an aluminum-yttrium alloy layer without containing nitrogen over the first aluminum-yttrium alloy nitride layer; and
   a second aluminum-yttrium alloy nitride layer disposed over the aluminum-yttrium alloy layer.

* * * * *